United States Patent [19]
Tanaka et al.

[11] Patent Number: 5,290,725
[45] Date of Patent: Mar. 1, 1994

[54] SEMICONDUCTOR MEMORY DEVICE AND A METHOD FOR PRODUCING THE SAME

[75] Inventors: Kenichi Tanaka, Nara; Keizo Sakiyama, Kashihara, both of Japan

[73] Assignee: Sharp Kabushiki Kaisha, Osaka, Japan

[21] Appl. No.: 723,301

[22] Filed: Jun. 28, 1991

[30] Foreign Application Priority Data

Jun. 29, 1990 [JP] Japan ................................ 2-173802

[51] Int. Cl.⁵ .......................................... H01L 27/108
[52] U.S. Cl. .......................................... 437/52; 437/43; 437/48; 257/278; 257/296; 257/315; 257/312; 257/321
[58] Field of Search ................. 437/43, 48, 51, 52, 437/69, 70; 257/296, 321, 328; 365/185

[56] References Cited

U.S. PATENT DOCUMENTS

| | | | |
|---|---|---|---|
| 4,672,580 | 6/1987 | Yau et al. | 257/321 |
| 4,701,776 | 10/1987 | Perlegos et al. | 257/321 |
| 4,851,361 | 7/1989 | Schumann et al. | 257/321 |
| 5,140,551 | 8/1992 | Chiu | 257/296 |
| 5,169,729 | 12/1992 | Katoh et al. | 257/398 |
| 5,183,773 | 2/1993 | Miyata | 437/43 |

OTHER PUBLICATIONS

Article from C.I.C.C. Resumes entitled "A 72K CMOS Channelless Gate Array with Embedded 1Mbit Dynamic RAM" by Sawada et al., 1988; pp. 20.3.1 to 20.3.4.

*Primary Examiner*—Olik Chaudhuri
*Assistant Examiner*—Richard A. Booth

[57] ABSTRACT

A method for producing a semiconductor memory device including a volatile memory element, a non-volatile memory element, and a driver in combination on a silicon conductive substrate is provided. The volatile memory element is a DRAM and is disposed in and on a reverse-conductive well. A charge storage electrode layer of the DRAM is partly disposed on a transfer gate electrode layer with an insulating film sandwiched therebetween. The non-volatile memory element is a mask read-only memory and/or a programmable read-only memory.

3 Claims, 2 Drawing Sheets

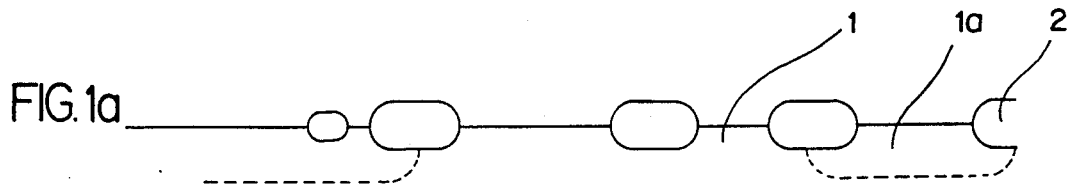
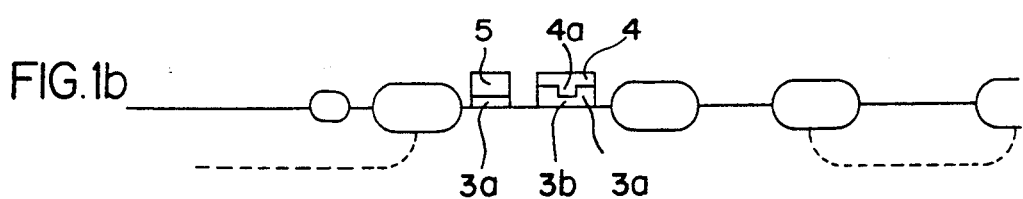
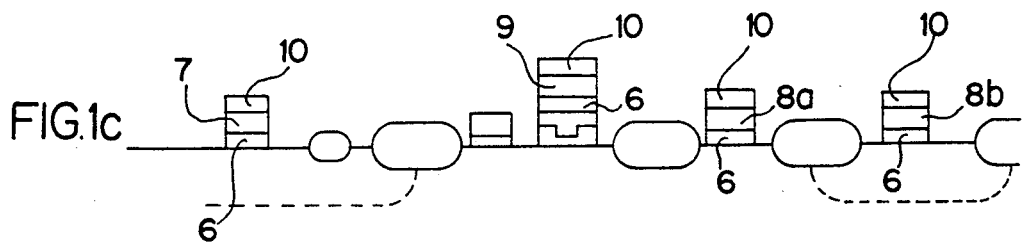
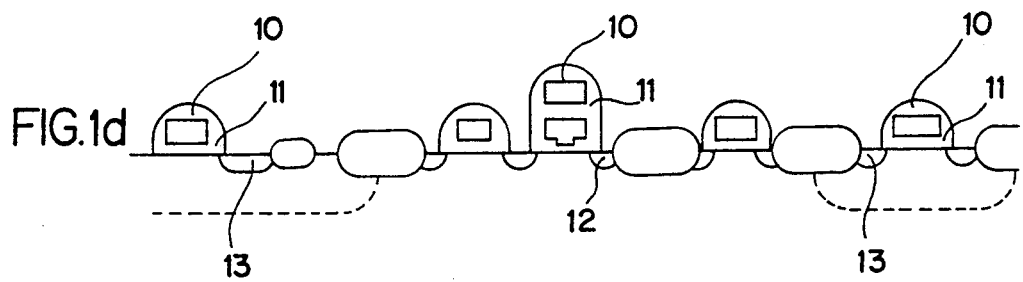
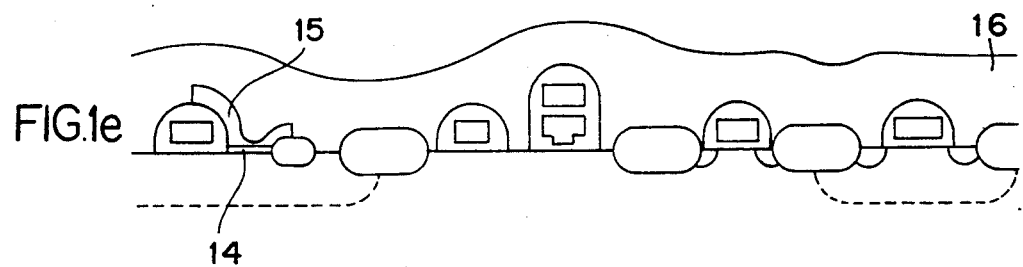

SEMICONDUCTOR MEMORY DEVICE AND A METHOD FOR PRODUCING THE SAME

BACKGROUND OF THE INVENTION

1. Field of the Invention

The present invention relates to a semiconductor memory device and a method for producing the same.

2. Description of the Related Art

In the past, a semiconductor memory device in which a dynamic random access memory (1 megabit DRAM) and a gate array are formed on one silicon substrate has been known (CICC Resumes, Mar. 20, 1988). In this semiconductor memory device, as shown in FIG. 2, N-wells 22a, 22b and P-wells 23 are formed in an N-type silicon substrate 21. A DRAM 30 is formed inside and on the N-wells 22a, 22b. A cut P-well 31 or a gate array 32 is formed inside and on the P-wells 23. In the DRAM 30, a charge storage electrode layer 26a is formed by etching a first polysilicon layer to a predetermined pattern, and a transfer gate electrode layer 26b is formed by etching a second polysilicon layer to a predetermined pattern. In FIG. 2, the reference numeral 24 denotes a small amount of carriers, reference numeral 25 denotes a capacitor, reference numeral 27 denotes a first wiring layer made of Al, 28 a second wiring layer made of Al, and reference numeral 29 denotes a memory element.

However, according to the above construction, in which the charge storage electrode layer 26a is formed from the first polysilicon layer, and after that the transfer gate electrode layer 26b is formed from the second polysilicon layer, resulting in a formation of a DRAM, when a DRAM, a read only memory (ROM), and a driver are formed in combination on a substrate, a production process becomes complicated and moreover, each memory element occupies a wide area on the substrate, causing poor integration.

SUMMARY OF THE INVENTION

The semiconductor memory device of this invention, which overcomes the above-discussed and numerous other disadvantages and deficiencies of the known memory devices comprises, a volatile memory element, a non-volatile memory element, and a driver in combination on a silicon substrate.

In a preferred embodiment, the volatile memory element is disposed in and on a reverse-conductive well formed in the conductive silicon substrate.

In a preferred embodiment, the volatile memory element is a dynamic random access memory including a transistor and a capacitor, and the capacitor includes a charge storage electrode layer which is partly disposed on a transfer gate electrode layer forming the transistor with an insulating film sandwiched therebetween.

In a preferred embodiment, the non-volatile memory element is a mask read-only memory and/or a programmable read-only memory.

A method for producing a semiconductor memory device comprises the steps of:

forming a first insulating film on a conductive silicon substrate in which a plurality of reverse conductive wells and a plurality of element separation regions are formed;

forming a first polysilicon layer on the first insulating film;

patterning the first polysilicon layer to form a floating gate electrode layer of a non-volatile memory element and a transistor gate electrode layer with a pressure breakdown-voltage resistance of 20 V or less;

forming a second insulating film on the silicon substrate;

forming a second polysilicon layer on the second insulating film;

patterning the second polysilicon layer to form a logic electrode layer, a transfer gate electrode layer of a volatile memory element, a driver electrode layer, and a control gate electrode layer of a non-volatile memory element;

forming a third insulating film on the silicon substrate;

forming a third polysilicon layer on the third insulating film; and patterning the third polysilicon layer to form a charge storage electrode layer of a volatile memory element so that the charge storage electrode layer is partly disposed on the transfer gate electrode layer with the third insulating film sandwiched therebetween.

Thus, the invention described herein makes possible the objectives of (1) providing a semiconductor memory device which can be readily produced, and a method for producing the same; and (2) providing a semiconductor memory device in which an area occupied by each memory element is small and high-integration can be realized, and a method for producing the same.

BRIEF DESCRIPTION OF THE DRAWINGS

This invention may be better understood and its numerous objects and advantages will become apparent to those skilled in the art by reference to the accompanying drawings as follows:

FIGS. 1a to 1f are a series of steps for illustrating a semiconductor device according to an embodiment of the present invention.

DESCRIPTION OF THE PREFERRED EMBODIMENTS

Figure 1F:
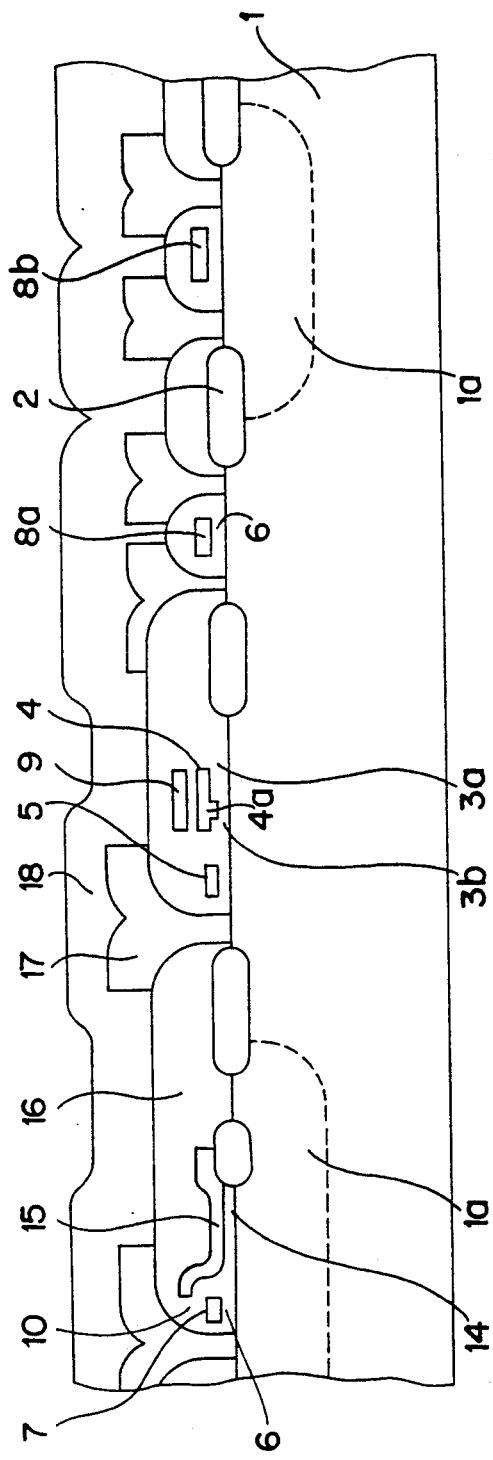
Figure 2:
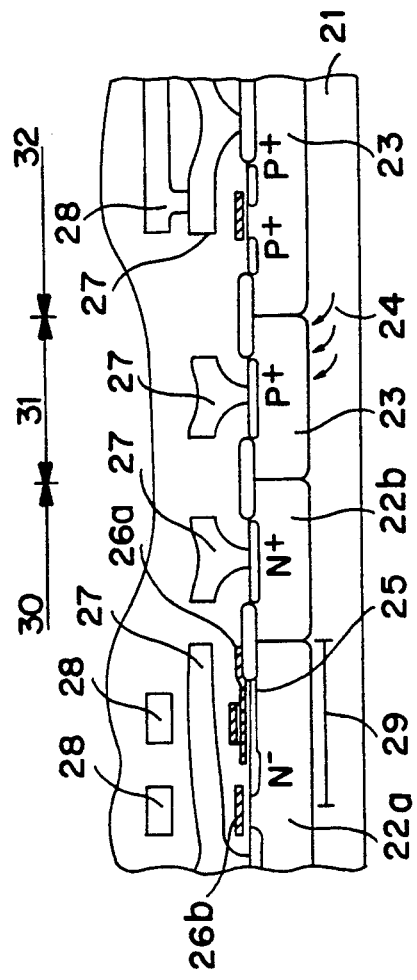
FIG. 2 is a diagram illustrating a conventional semiconductor device.

In a semiconductor memory device of the present invention, a volatile memory element, a non-volatile memory element and a driver are formed in combination on a silicon substrate.

As the volatile memory element, a DRAM which includes a transistor and a capacitor is preferably used.

It is preferred that a charge storage electrode layer forming the capacitor is partly disposed on a transfer gate electrode layer which forms the transistor with an insulating layer sandwiched therebetween. This construction is different from a conventional one in which a charge storage electrode layer is disposed side by side with respect to a transfer gate electrode layer, and makes possible high integration and simplifies the production steps. Moreover, since the transfer gate electrode layer is formed prior to the charge storage electrode layer, a memory element with a FLOTOX (Floating Gate Thin Oxide) construction (EEPROM) and a DRAM can be formed on one chip.

The conductive silicon substrate has a reverse-conductive well, and the volatile memory element is preferably formed in and on this reverse-conductive well. Due to this construction, a bias voltage can be applied to the volatile memory element portion alone, which is on the silicon substrate.

As the non-volatile memory element, a mask read-only memory (MROM) and/or a programmable read-only memory (PROM) are preferably used. In particular, an electrically erasable programmable read-only memory (EEPROM) or an erasable programmable read-only memory (EPROM) which can erase and rewrite stored information by using ultraviolet light and x-ray are preferably used. The above-mentioned EEPROM is a memory element with a FLOTOX construction, and generally has a thin oxide film with a thickness of about 50 to 150 Å. In view of the regulation of the thickness of a film, it is preferred that this oxide film is formed by oxidizing a silicon surface of a silicon substrate.

The above-mentioned non-volatile memory element is preferably formed outside the reverse-conductive well so as not to be applied with a substrate bias voltage.

A semiconductor memory device for an embodiment of the present invention can be produced, for example, as follows:

First, reverse-conductive wells are formed in some parts of a conductive silicon substrate, and element separation regions are formed. In a region for forming elements on this silicon substrate, a first insulating film with two kinds of thickness is formed, and a first polysilicon layer is formed on the first insulating film. After that, this polysilicon layer is patterned, thereby forming a floating gate electrode layer of an EEPROM and a transistor gate electrode layer with a breakdown-voltage of 20 V or less. Then, a second insulating film is formed on this silicon substrate, and a second polysilicon layer is formed on the second insulating film. After that, this polysilicon layer, a transfer gate electrode layer of a DRAM, a driver electrode layer, and a control gate electrode layer of a non-volatile memory. Then N-type or P-type impurities are injected into source and drain portions of this silicon substrate. Moreover, a third insulating film is formed on this silicon substrate, and a third polysilicon layer is formed on the third insulating film. This polysilicon layer is patterned, thereby forming a charge storage electrode layer of a DRAM so that the charge storage electrode layer is partly disposed on the transfer gate electrode layer with the insulating film sandwiched therebetween. An insulating film is formed on this silicon substrate, and contact holes are formed in several portions of this insulating film. Metal wiring layers are formed in these contact holes. Finally, a protective film is formed on this silicon substrate, thereby producing a semiconductor memory device for an embodiment of the present invention.

A thin portion of the first insulating film is formed so that electrons for a memory can move between a channel and a trap layer at the lower part of the floating gate electrode layer of a non-volatile memory. A silicon oxide film with a thickness of 50 to 150 Å is generally used for this portion. This silicon oxide film is preferably formed by thermal oxidation. Moreover, a thick portion of the first insulating film having a thickness of 300 to 500 Å can be used as an insulating film of the transistor gate electrode layer with a breakdown-voltage of 20 V or less.

The first polysilicon layer can be formed, for example, by the CVD method. The thickness of this film is preferably in the range of 3,000 to 5,000 Å.

It is preferred that the second insulating film can be used as insulating films of the logic electrode layer, the transfer gate electrode layer, the driver electrode layer, and the control gate electrode layer of a non-volatile memory element. For example, this film can be formed from silicon oxide, silicon nitride, etc. with a thickness of 200 to 500 Å.

The second polysilicon layer can be formed in the same way as in the first polysilicon layer, and its thickness is generally in the range of 3,000 to 5,000 Å. Also, polycide formed from metal with a high melting point can be used.

The third insulating film preferably constitutes a dielectric layer of the capacitor forming a DRAM. For example, this film can be formed by a silicon oxide layer and a laminated layer including silicon oxide and silicon nitride. The thickness of this third insulating film is generally in the range of 50 to 150 Å.

The third polysilicon layer can be formed in the same way as in the first polysilicon layer. The thickness is generally in the range of 1,500 to 3,000 Å.

According to the above-mentioned method, a semiconductor device including one silicon substrate having various functions such as a read-only memory function, a mask read-only memory function, and a programmable read-only memory function can be produced.

EXAMPLE

The present invention will be described with reference to FIGS. 1a to 1f.

Phosphorus is diffused in a P− silicon substrate 1 to form N-wells 1a with a depth of about 3 μm so that an impurity density on the surface of the N-wells 1a is $1 \times 10^{16}$ to $5 \times 10^{16}$ cm$^{-3}$. These N-wells 1a are generally used for disposing a DRAM and a P-channel transistor when forming a CMOS. On the P− silicon substrate 1 are formed a plurality of element separation regions 2 by using an LOCOS method. (See FIG. 1a).

Next, a thick silicon oxide film 3a, which is a first insulating film of a gate oxide film, with a thickness of 400 Å is formed in a region for forming elements on the silicon substrate 1 by using thermal oxidation. Then, a portion of the thick silicon oxide film 3a is etched to form an opening, and a thin silicon oxide film 3b with a thickness of 50 to 150 Å is formed therein. On the entire surface of the silicon substrate 1, a first polysilicon layer (made of polysilicon doped with phosphorus) with a thickness of 3000 Å is formed by the CVD method. After that, as shown in FIG. 1b, the polysilicon layer is etched to a predetermined pattern so as to form a floating gate electrode layer 4 of an EEPROM and a transistor gate electrode layer 5 with a breakdown-voltage of 20 V. On the upper portion of the thin silicon oxide film 3b, a trap layer 4a is formed with the floating gate electrode layer 4 disposed thereon.

On the substrate 1 under the above conditions, a thermal oxide film with a thickness of 50 to 150 Å is formed. Moreover, a silicon nitride film with a thickness of 100 to 200 Å is formed on this thermal oxide film by the CVD method. After that, an upper portion of the floating gate electrode layer 4 of an EEPROM of this silicon nitride film is masked with a photoresist, and the other portions of the thermal oxide film and the silicon nitride portion are removed by etching. Next, a silicon oxide film of a second insulating film 6 which is a gate oxide film with a thickness of 150 to 250 Å is formed on the silicon substrate 1 by thermal oxidation. The second insulating film 6 is formed so as to insulate portions where a transfer gate electrode layer, a driver electrode layer, a logic electrode layer, and a control gate electrode layer of an EEPROM are formed. Then, a second polysilicon layer with a thickness of 1,500 Å is formed by the CVD method. This second polysilicon layer contains phosphorus. Moreover, in order to decrease resistance of the gate electrode, a tungsten silicide film with a thickness of 1,500 to 2,500 Å is formed on the second polysilicon layer. On the tungsten silicide film, an SiO$_2$ film 10 with a thickness of 1,500 to 2,500 Å is formed by the CVD method. This SiO$_2$ film 10 is formed for the purpose of reducing a capacitive coupling between the transfer gate electrode layer of the DRAM portion and the charge storage electrode layer. After this, the second insulating film 6, the second polysilicon layer, the tungsten silicide film, and the SiO$_2$ film 10 are etched to a predetermined pattern to form a transfer gate electrode layer 7, a driver electrode layer 8a, and a logic electrode layer 8b, and a control gate electrode layer 9 of an EEPROM, as shown in FIG. 1c.

Phosphorus with a low concentration ($6 \times 10^{14}$ cm$^{-2}$) is injected into source and drain portions of an N-channel MOS transistor on the silicon substrate 1 by ion implantation, and BF$_2$ with a low concentration ($6 \times 10^{14}$ cm$^{-2}$) is injected into source and drain portions of a P-channel MOS transistor by ion implantation, thereby forming N$^-$ portions 12 and P$^-$ portions 13 with an LDD construction. Moreover, an SiO$_2$ film with a thickness of 3,000 Å is formed on the entire surface of the silicon substrate 1 by the CVD method. Then, this SiO$_2$ film is subjected to an isotropic etching, thereby providing an SiO$_2$ film 11 (side wall) on the side surface of the gate electrode that is, the floating gate electrode layer 4, the transistor gate electrode layer 5, the transfer gate electrode layer 7, the driver electrode layer 8a, the logic electrode layer 8b, and the control gate electrode layer 9, as shown in FIG. 1d. Under the conditions that the gate electrode and the side wall are masked, arsenic with a high concentration is injected into the N$^-$ portions 12, and BF$_2$ with a high concentration is injected into the P$^-$ portions 13, respectively by ion implantation.

Next, a silicon oxide film on the silicon substrate 1 corresponding to a portion where a capacitor of a DRAM is formed later is removed. Then, a silicon nitride film 14 of a third insulating film with a thickness of 70 Å is formed by the CVD method on the portion where the silicon oxide film is removed. A third polysilicon layer with a thickness of 1,500 Å is formed by the CVD method. This third polysilicon layer is etched to a predetermined pattern, thereby forming a charge storage electrode layer 15 which is partly disposed on the transfer gate electrode layer 7 with the SiO$_2$ film 10 sandwiched therebetween.

As shown in FIG. 1e, an insulating layer 16 with a thickness of 6,000 Å is formed on the entire surface of the silicon substrate 1. Then, contact holes are formed in predetermined positions. An Al-type metal layer is formed in the contact holes by sputtering method. The Al-type metal layer is patterned to form an Al metal wiring layer 17. Moreover, on the entire surface of the silicon substrate 1, a protective film 18 is formed, thereby producing a semiconductor memory device.

According to the embodiment of the present invention, a semiconductor memory device including a volatile memory element, a non-volatile memory element, and a driver on one silicon substrate with high integration can be provided. Moreover, a method for producing this semiconductor memory device can be provided.

It is understood that various other modifications will be apparent to and can be readily made by those skilled in the art without departing from the scope and spirit of this invention. Accordingly, it is not intended that the scope of the claims appended hereto be limited to description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a semiconductor memory device comprising the steps of:
    forming a first insulating film on a conductive silicon substrate in which a plurality of reverse conductive wells and a plurality of element separation regions are formed;
    forming a first polysilicon layer on the first insulating film;
    patterning the first polysilicon layer to form a floating gate electrode layer of a non-volatile memory element and a transistor gate electrode layer with a breakdown-voltage of 20 V or less;
    forming a second insulating film on the silicon substrate;
    forming a second polysilicon layer on the second insulating film;
    patterning the second polysilicon layer to form a logic electrode layer, a transfer gate electrode layer of a volatile memory element, a driver electrode layer, and a control gate electrode layer of a non-volatile memory element;
    forming a third insulating film on the silicon substrate;
    forming a third polysilicon layer on the third insulating film; and
    patterning the third polysilicon layer to form a charge storage electrode layer of a volatile memory element so that the charge storage electrode layer is partly disposed on the transfer gate electrode layer with the third insulating film sandwiched there-between.

2. A method for producing a semiconductor memory device according to claim 1, wherein said volatile memory element comprises a dynamic access memory.

3. A method for producing a semiconductor memory device according to claim 1, wherein said non-volatile memory element comprises a mask read-only memory, a programmable read-only memory, or a mask read-only memory and a programmable read-only memory.

* * * * *